United States Patent [19]

Nakamura et al.

[11] Patent Number: 4,987,009
[45] Date of Patent: Jan. 22, 1991

[54] PRODUCING METHOD OF THICK FILM COMPLEX COMPONENT

[75] Inventors: Kiichi Nakamura, Yachiyo; Masami Itakura; Yasuhiko Atsumi, both of Kawasaki; Hideo Watanabe, Chiba; Youiti Kanagawa, Katsushika, all of Japan

[73] Assignee: TDK Corporation, Tokyo, Japan

[21] Appl. No.: 436,124

[22] Filed: Nov. 13, 1989

Related U.S. Application Data

[63] Continuation of Ser. No. 255,141, Oct. 7, 1988, abandoned.

[30] Foreign Application Priority Data

Oct. 9, 1987 [JP] Japan ............... 62-254879

[51] Int. Cl.$^5$ .............................. C23C 26/00
[52] U.S. Cl. .................... 427/96; 427/126.2; 427/126.3; 427/132; 427/79
[58] Field of Search ............ 427/96, 126.2, 126.3, 427/132, 79

[56] References Cited

U.S. PATENT DOCUMENTS

| | | | |
|---|---|---|---|
| 2,590,893 | 4/1952 | Sanborn | 427/126.2 |
| 2,759,854 | 8/1956 | Kilby | 427/96 |
| 2,820,727 | 1/1958 | Grattidge | 427/126.6 |
| 2,934,667 | 4/1960 | Pincus | 427/126.2 |
| 2,953,704 | 9/1960 | Harris | 427/126.2 |
| 3,798,059 | 3/1974 | Astle | 427/96 |
| 3,860,450 | 1/1975 | Nicolet | 427/96 |
| 4,103,267 | 7/1978 | Olschewski | 336/65 |
| 4,688,015 | 8/1987 | Kojima | 338/310 |
| 4,720,394 | 1/1988 | Kojima | 427/96 |
| 4,816,292 | 3/1989 | Machida | 427/132 |

FOREIGN PATENT DOCUMENTS 466321 7/1950 Canada ............ 427/126.2

OTHER PUBLICATIONS

Robert C. Weast et al. "CRC Handbook of Chemistry and Physics" CRC Press, Inc. 1980 pp. B-99, B-109.

*Primary Examiner*—Shrive Beck
*Assistant Examiner*—Vi Duong Dang
*Attorney, Agent, or Firm*—Burgess, Ryan & Wayne

[57] ABSTRACT

A thick film complex electronic component mounted on a substrate including an inductance, capacitance and/or resistance by a conductive film and a magnetic film on a ceramic substrate is improved by novel magnetic film. The magnetic film is produced by depositing paste of a raw material of ferrite on the substrate, and the paste together with the substrate are sintered at a relatively low temperature in the range of 600° C. and 1200° C. The present magnetic film which is sintered after the raw material of ferrite is deposited on the ceramic substrate has higher permeability and is mechanically stronger.

11 Claims, 4 Drawing Sheets

PRODUCING METHOD OF THICK FILM COMPLEX COMPONENT

This application is a continuation of application Ser. No. 255,141, filed Oct. 7, 1988, now abandoned.

BACKGROUND OF THE INVENTION

The present invention relates to a method of producing a thick film complex electronic component, for instance an LC (inductance, capacitance) complex component, and/or LCR (inductor, capacitor, resistor) complex component. In particular, the present invention relates to a method for producing a component on a ceramic substrate with a sintered ferrite film having an excellent magnetic property and strong film so that a high inductance and/or shield effect of a component on a substrate is obtained.

Conventionally, a thick film electronic component comprises a ceramic substrate with laminates of a thick film conductive pattern and an insulating layer. However, that structure has the disadvantage that large inductance can not be obtained.

Another prior art method is shown in the Japanese utility model laid open publication No. 43690/84, which shows laminates of a magnetic layer and a conductive layer which provides a coil.

However, the prior magnetic layer in said publication is ferrite paste painted on a substrate. That ferrite paste is produced through the steps of sintering ferrite material around 1500° C., powdering the sintered ferrite, and adding another material for providing ferrite paste. The ferrite paste thus produced is painted on the substrate and is dried. But it has the disadvantages that the density of the ferrite itself in the paste is small (low magnetic permeability), and the magnetic film is not mechanically strong.

SUMMARY OF THE INVENTION

It is an object, therefore, of the present invention to overcome the limitations and disadvantages of a prior thick film complex electronic component by providing a new and improved method of producing a thick film complex electronic component.

It is also an object of the present invention to provide a method of producing a thick film complex electronic component which can provide higher inductance.

It is still another object of the present invention to provide a method of producing a thick film complex electronic component which is excellent in shielding effect to the component.

It is still another object of the present invention to provide a method of producing a thick film complex electronic component which has strong films.

The above and other objects are attained by a producing method of a thick film complex electronic component having the steps of a thick film conductive pattern on a ceramic substrate, depositing a paste of ferrite material on said ceramic substrate, and sintering said ferrite material at a temperature in the range between 600° C. and 1200° C.

It is an important feature of the present invention that the paste of ferrite material, not ferrite itself, is deposited on a substrate, and then, sintered to produce ferrite. In the prior art, ferrite which is sintered at high temperature (for instance 1500° C.) is prepared beforehand, and the paste which includes the powdered ferrite is painted on a substrate. The ferrite is produced on the substrate according to the present invention.

Another important feature of the present invention is the relatively low sintering temperature (600° C. through 1200° C.), although the conventional temperature for producing ferrite is 1500° C. The high temperature would deteriorate or melt conductive patterns on the substrate.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

A producing method of an LC filter is now described as an embodiment of a method of producing a thick film electronic component.

Figure 1:
FIG. 1 is a cross section of the thick film complex component according to the present invention.
Figure 2A:
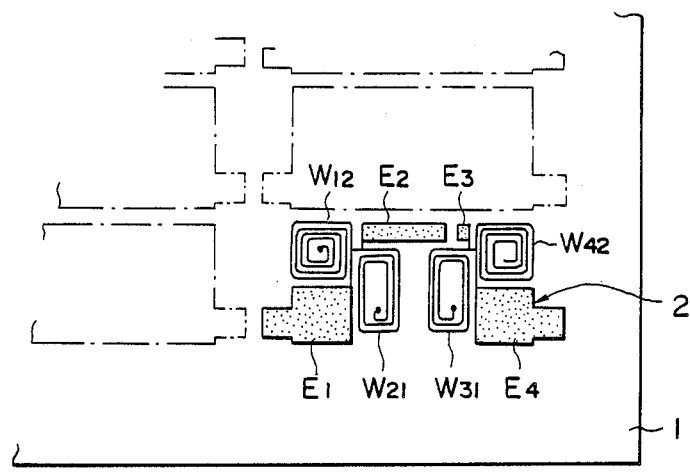
FIGS. 2A through 2C are plane views of the thick film complex component in the producing steps according to the present invention.
Figure 2B:
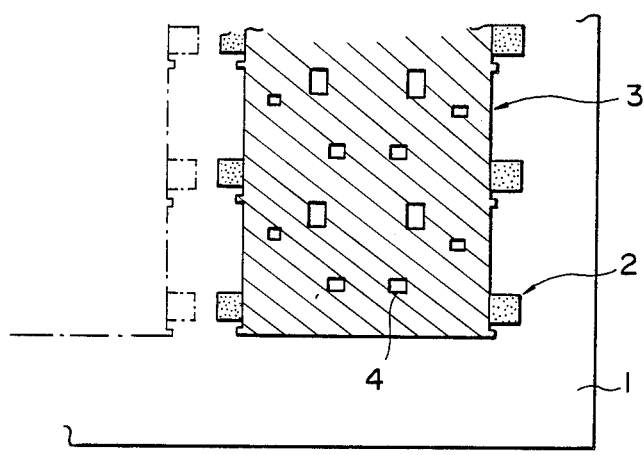
Figure 2C:
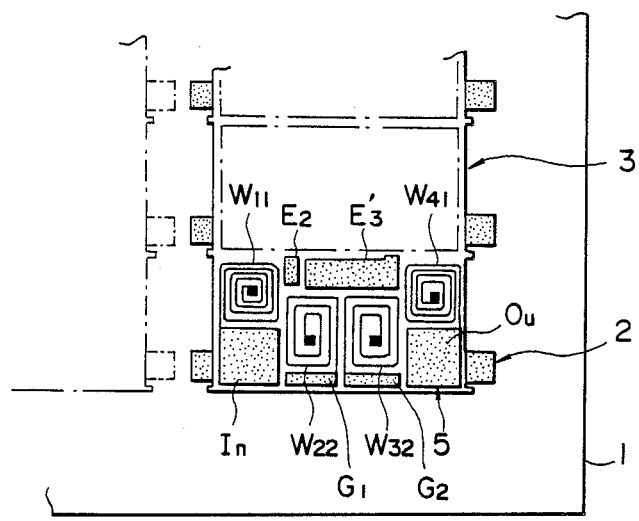

FIG. 1 shows a cross section of the component according to the present invention, and FIGS. 2A through 2C show the producing steps of the present electronic component.

As shown in FIG. 2A, a ceramic substrate 1 made of alumina is prepared. It is supposed that the substrate 1 is preliminary sintered. A first thick film conductive pattern 2 which has a winding, and/or a linear line is produced on the substrate 1 through screen printing of a silver paste which is sintered.

Next, the paste of ferrite material is painted on the ceramic substrate 1 and the thick film conductor pattern 2 through the screen print method. Said paste of ferrite material is the mixture of powder of ferrite material like $Fe_2O_3$, NiO, CoO, and the binder.

Alternatively, said powder may be the powder of pre-sintered ferrite material. Said paste is sintered together with the substrate and the conductor pattern at the temperature between 600° C. and 1200° C. during 30 minutes and 100 minutes, and the sintered ferrite film 3 in FIG. 2B is obtained. Some coupling holes 4 are provided on said ferrite film 3 so that said thick film conductor pattern 2 is electrically connected to another conductor pattern through said holes. Therefore, said conductor pattern 2 is disposed through the holes 4 on the ferrite film 3.

Next, the second thick film conductor pattern 5 is deposited on said ferrite film 3 as shown in FIG. 2C. The second conductor pattern 5 is made of silver paste which is painted on the ferrite film 3 through the screen printing method, and is sintered. The second conductive pattern 5 is electrically coupled with the first conductive pattern 2 through the holes 4.

Said ferrite paste is, for instance, manufactured through the steps of wet mixing the powder of NiO, CoO and $Fe_2O_3$ (which are materials of Ni group ferrite) with boron-silica glass powder, drying the mixture, sintering the dried mixture at 800° C. and grinding, and resolving into the terpineol together with ethyl cellulose to provide the paste. The weight percent of said boron silica glass is in the range between 15 wt. % and 35 wt. %. If the ratio is lower than 15% it is not effective to adhere on the ceramic substrate, and if the ratio is higher than 35%, the density of the ferrite would be too low, and the permeability of the ferrite is unsatisfactory.

Alternatively, said paste of ferrite material is manufactured through the steps of wet mixing the powder of NiO, CoO and $Fe_2O_3$ with boron-silica glass powder, drying the mixture, sintering the dried mixture at 800° C. and being grinded. Then, the powder of boron oxide ($B_2O_3$) with the weight percent of less than 10 wt. % is added. Then, the powder is resolved in the terpineol together with ethyl cellulose to provide the paste. The boron oxide is added so that the sintering operation is improved.

The ferrite material is not restricted to Ni-group ferrite, but conventional soft spinnel ferrite is also possible.

Figure 3:
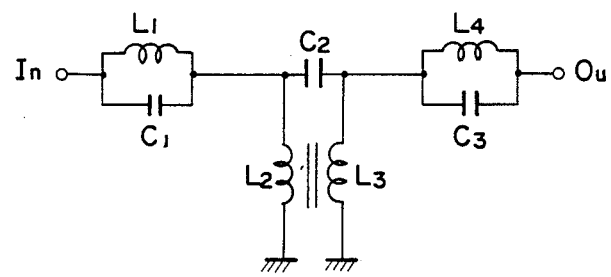
FIG. 3 is a circuit diagram of the thick film complex component according to the present invention.

FIG. 3 is a circuit diagram of an LC filter which is subject to be manufactured through the present invention. The capacitor $C_1$ is provided between the input electrode $I_n$ on the second conductive pattern 5 and the electrode $E_1$ on the first conductive pattern 2 through the ferrite film 3 which is dielectric. The inductor $L_1$ is provided by the winding $W_{11}$ coupled with the input electrode $I_n$ on the second conductive pattern 5, and the winding $W_{12}$ which is provided on the first conductive pattern 2 and is coupled with said winding $W_{11}$.

The inductor $L_2$ is provided by the winding $W_{21}$ coupled with the electrode $E_1$ on the first conductive pattern 2, and the winding $W_{22}$ which is provided on the second conductive pattern 5 and is coupled with said winding $W_{21}$. One end of the inductor $L_2$ is coupled with the ground electrode $G_1$ on the second conductive pattern 5.

The capacitor $C_2$ is provided between the electrode $E_2$ on the first conductive pattern 2 and the electrode $E_3'$ on the second conductive pattern 5 through the ferrite film 3. The electrode $E_3'$ of the capacitor $C_2$ is coupled with the electrode $E_3$(FIG. 2A).

The inductance $L_3$ is provided by the winding $W_{31}$ coupled with the electrode $E_3$ on the first conductive pattern 2, and the winding $W_{32}$ which is provided on the second conductive pattern 5 and is coupled with said winding $W_{31}$. One end of the inductor $L_3$ is coupled with the ground electrode $G_2$ on the second conductive pattern 5.

The capacitor $C_3$ is provided between the output electrode $O_u$ on the second conductive pattern 5 and the electrode $E_4$ on the first conductive pattern 2.

The inductor $L_4$ is provided by the winding $W_{41}$ which is coupled with the output electrode $O_u$ on the second conductive pattern 5, and the winding $W_{42}$ which is provided on the first conductive pattern 2 and is coupled with said winding $W_{41}$.

The use of the ferrite film 3 which is sintered to ferrite after the ferrite material is attached on a ceramic substrate is the feature of the present invention. It should be appreciated that the sintering temperature for the ferrite film is relatively low and is in the range between 600° C. and 1200° C. so that the conductive patterns do not melt and/or deteriorate in the sintering operation of the ferrite film. The ferrite film 3 sintered on the substrate has higher magnetic permeability than a prior ferrite film which is merely painted on the substrate and is dried. Therefore, the inductors $L_1$ through $L_4$ can be larger than those of a prior art, and the coupling coefficient between the inductors $L_2$ and $L_3$ can be larger than that of a prior art. Further, the sintered ferrite film 3 is harder and stronger than a prior ferrite film, since it is sintered on the substrate which carries the electronic components.

Figure 4:
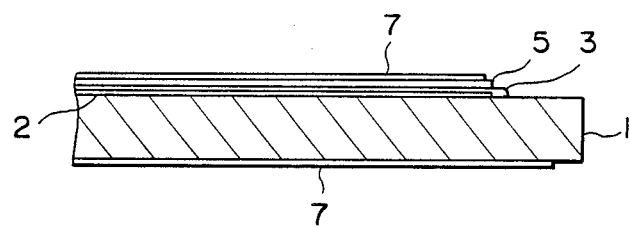
FIG. 4 is a cross section of another embodiment according to the present invention.

FIG. 4 is sectional view of another embodiment of the present invention. The feature of FIG. 4 is the presence of the second sintered ferrite film 7 on the circuit patterns (2,3,5), and on the bottom surface of the substrate 1 so that the shield effect for the circuit pattern is improved. The ferrite film 7 is produced through the similar method to that of the ferrite film of FIG. 1. The embodiment of FIG. 4 has the advantage that the circuit operation is not disturbed by an external high frequency noise.

As a modification, a conductive pattern (2,5) is made of copper so that the fine pattern with excellent Q value are obtained. In that case, the ferrite film must be sintered in the inactive atmosphere (for instance nitrogen).

As another modification, a first conductive pattern 2, a ferrite film 3 and a second conductive pattern 5 are sintered simultaneously.

Figure 5:
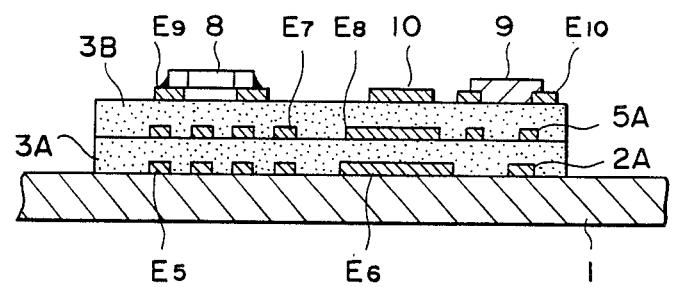
FIG. 5 is a cross section of still another embodiment according to the present invention.

FIG. 5 shows a sectional view of another embodiment of the present invention. The embodiment of FIG. 5 has the substrate 1, a first thick film conductor pattern 2A having the inductor electrode $E_5$, the capacitor electode $E_6$ et al on the substrate 1, a sintered ferrite film 3A, a second thick film conductor pattern 5A having the inductor electrode $E_7$, the capacitor electrode $E_8$ et al, the sintered ferrite film 3B, and the third thick film conductor pattern 10 which has the electrodes $E_9$ and $E_{10}$ for coupling a chip component 8 and a printed resistor film 9. The embodiment of FIG. 5 provides a multilayer printed substrate including inductors and capacitors, and is able to attach a chip component and-/or a printed resistor.

As described above in detail, according to the present invention, a thick film component is produced through the steps of providing thick film conductive patterns on a ceramic substrate, painting paste of a ferrite material on the conductive film, sintering the ferrite paste at the temperature in the range between 600° C. and 1200° C. Since the sintered ferrite film is hard, high in density, and has high magnetic permeability, higher inductance is obtained as compared with the prior art. The manufacturing process of the present invention is simple, since the sintering temperature is low and is equal to that for producing a conventioanl thick film component. Further, since the sintered ferrite film has a high magnetic permeability, the magnetic shield effect is excellent.

From the foregoing it will now be apparent that a new and improved method of producing a thick film complex electronic component has been found. It should be understood of course that the embodiments disclosed are merely illustrative and are not intended to limit the scope of the invention. Reference should be made to the appended claims, therefore, rather than the specification as indicating the scope of the invention.

We claim:

1. A method of producing a thick film complex electronic component including an inductance and a capacitance, having at least a substrate, and a conductive pattern and a magnetic film pattern for electrode of said capacitance and wires of said inductance and a dielectric layer for said capacitance, comprising the steps of:

depositing a first thick film conductive pattern directly on a ceramic substrate, depositing a paste of ferrite material which is not magnetic ferrite directly on said conductive pattern, so that a plurality of holes are provided on a film of said ferrite material, sintering said ferrite material at a temperature in the range between 600° C. and 1200° C. to product magnetic dielectric ferrite film, and depositing a second thick film conductive pattern on the ferrite film thus sintered so that said second conductive pattern is electrically connected to said first conductive pattern through holes in the ferrite film to provide an inductance by wires of said first conductive pattern and said second conductive pattern and a magnetic ferrite film in said wires, and a capacitance between said first conductive pattern and said second conductive pattern through the ferrite film which is dielectric.

2. A method of producing a thick film complex electronic component according to claim 1, wherein said paste of ferrite material includes boron oxide ($B_2O_3$).

3. A method of producing a thick film complex electronic component according to claim 1, wherein other pastes of ferrite material are attached on an upper surface and bottom surface of the component, and are sintered at a temperature in the range between 600° C. and 1200° C.

4. A method of producing a thick film complex electronic component according to claim 1, wherein said paste of ferrite material includes boron-silica glass with a weight percent between 15 wt. % and 35 wt. %.

5. A method of producing a thick film complex electronic component according to claim 1, wherein said paste of ferrite material includes NiO, CoO and $Fe_2O_3$.

6. A producing method of a thick film complex electronic component according to claim 1, wherein said paste of ferrite material is pre-sintered at approximately 800° C., powdered, and resolved in solvent.

7. A method of producing a thick film complex electronic component according to claim 1, wherein said conductive pattern is made of copper, and said sintering is accomplished in an inactive atmosphere.

8. A method of producing a thick film complex electronic component according to claim 1, wherein said conductive pattern includes a winding for inductance.

9. A method of producing a thick film complex electronic component according to claim 1, wherein the time for sintering is in the range between 30 minutes and 100 minutes.

10. A method of producing a thick film complex electronic component according to claim 1, wherein a plurality of pairs of conductive patterns and pastes of ferrite material are provided on the ceramic substrate.

11. A method of producing a thick film complex electronic component having a substrate, at least one conductive pattern and at least one magnetic film pattern comprising the steps of:

depositing a thick film conductive pattern directly on a ceramic substrate, depositing a paste comprised of a non-magnetic ferrite material directly on said conductive pattern, sintering said ferrite material at a temperature in the range of between 600° C. and 1200° C. for a period of time to produce magnetic ferrite.

* * * * *